United States Patent
Siemieniec et al.

(10) Patent No.: US 10,332,876 B2
(45) Date of Patent: Jun. 25, 2019

(54) METHOD OF FORMING COMPOUND SEMICONDUCTOR BODY

(71) Applicant: Infineon Technologies Austria AG, Villach (AT)

(72) Inventors: Ralf Siemieniec, Villach (AT); Daniel Kueck, Villach (AT); Gilberto Curatola, Villach (AT); Romain Esteve, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 15/704,134

(22) Filed: Sep. 14, 2017

(65) Prior Publication Data

US 2019/0081039 A1    Mar. 14, 2019

(51) Int. Cl.

| | |
|---|---|
| *H01L 21/8258* | (2006.01) |
| *H01L 27/06* | (2006.01) |
| *H01L 29/16* | (2006.01) |
| *H01L 29/808* | (2006.01) |
| *H01L 29/66* | (2006.01) |
| *H01L 29/205* | (2006.01) |
| *H01L 29/778* | (2006.01) |
| *H01L 29/20* | (2006.01) |

(52) U.S. Cl.
CPC ...... *H01L 27/0688* (2013.01); *H01L 21/8258* (2013.01); *H01L 29/1608* (2013.01); *H01L 29/2003* (2013.01); *H01L 29/205* (2013.01); *H01L 29/66068* (2013.01); *H01L 29/66462* (2013.01); *H01L 29/7787* (2013.01); *H01L 29/8083* (2013.01)

(58) Field of Classification Search
CPC ............. H01L 27/0688; H01L 29/8083; H01L 29/66462; H01L 29/2003; H01L 29/1608; H01L 29/7787; H01L 29/205; H01L 21/8258; H01L 29/66068
See application file for complete search history.

(56) References Cited

U.S. PATENT DOCUMENTS

| | | | | |
|---|---|---|---|---|
| 6,157,049 A | * | 12/2000 | Mitlehner | H01L 27/085 257/124 |
| 6,242,324 B1 | * | 6/2001 | Kub | B82Y 10/00 257/E21.122 |
| 8,216,368 B2 | * | 7/2012 | Faure | C30B 25/18 117/103 |

(Continued)

OTHER PUBLICATIONS

Wei, Jin et al., "Proposal of a Novel GaN/SiC Hybrid Fet (HyFET) with Enhanced Performance for High-Voltage Switching Applications", Proceedings of the 2016 28th International Symposium on Power Semiconductor Devices and ICs (ISPSD), Jun. 12-16, 2016, pp. 1-4.

*Primary Examiner* — Jarrett J Stark
(74) *Attorney, Agent, or Firm* — Murphy, Bilak & Homiller, PLLC

(57) ABSTRACT

A first semiconductor body including type IV semiconductor material is provided. A second semiconductor body including type III-V semiconductor material is provided. A first adhesion layer is formed on the first semiconductor body. A second adhesion layer is formed on the second semiconductor body. The first and the second semiconductor bodies are bonded together by adhering the first and the second adhesion layers to one another.

17 Claims, 7 Drawing Sheets

(56) References Cited

U.S. PATENT DOCUMENTS

| | | | |
|---|---|---|---|
| 8,686,428 B1* | 4/2014 | Sekar | H01L 21/8221 257/173 |
| 8,803,206 B1* | 8/2014 | Or-Bach | H01L 25/0657 257/278 |
| 9,496,137 B2* | 11/2016 | Chu | H01L 29/861 |
| 9,564,414 B2* | 2/2017 | Enquist | |
| 9,570,438 B1 | 2/2017 | Curatola et al. | |
| 9,653,642 B1* | 5/2017 | Raring | H01L 33/0075 |
| 9,666,677 B1* | 5/2017 | Raring | H01L 29/205 |
| 2001/0024138 A1* | 9/2001 | Dohnke | H01L 27/085 327/434 |
| 2005/0110159 A1* | 5/2005 | Oh | H01L 21/76251 257/777 |
| 2005/0258483 A1* | 11/2005 | Templier | H01L 29/868 257/341 |
| 2006/0060871 A1 | 3/2006 | Beach et al. | |
| 2006/0289901 A1* | 12/2006 | Sheppard | H01L 27/20 257/256 |
| 2007/0278518 A1 | 12/2007 | Chen et al. | |
| 2008/0191216 A1* | 8/2008 | Machida | H01L 25/18 257/76 |
| 2008/0296771 A1* | 12/2008 | Das | H01L 21/0475 257/758 |
| 2009/0072243 A1* | 3/2009 | Suda | H01L 21/26506 257/77 |
| 2010/0258843 A1 | 10/2010 | Lidow et al. | |
| 2010/0295136 A1* | 11/2010 | Or-Bach | H01L 21/76254 257/390 |
| 2011/0233617 A1* | 9/2011 | Or-Bach | H01L 21/76254 257/202 |
| 2012/0193677 A1* | 8/2012 | Parikh | H01L 29/1075 257/190 |
| 2015/0108958 A1* | 4/2015 | Xu | H01L 29/1602 323/282 |
| 2015/0279725 A1* | 10/2015 | Waldron | H01L 21/76251 257/506 |
| 2016/0254808 A1* | 9/2016 | Sato | H03K 17/6871 323/271 |
| 2017/0040312 A1* | 2/2017 | Curatola | H01L 27/0688 |
| 2017/0294848 A1* | 10/2017 | Levin | H02M 1/36 |

* cited by examiner

METHOD OF FORMING COMPOUND SEMICONDUCTOR BODY

TECHNICAL FIELD

The instant application relates to power transistors, and in particular relates to high electron mobility power transistors with high breakdown voltage ratings.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN.

In a GaN/AlGaN based HEMT, a two-dimensional electron gas (2DEG) arises at the interface between the AlGaN barrier layer and the GaN buffer layer. In an HEMT, the 2DEG forms the channel of the device instead of a doped region, which forms the channel in a conventional MOSFET device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Typically, measures must be taken to prevent the channel region of an HEMT from being in a conductive state in the absence of a positive gate voltage.

HEMTs are viewed as an attractive candidate for power transistor applications. A power transistor is a device that is capable of switching substantial voltages and/or currents associated with high power applications. For example, a power transistor may be required to block a voltage of at least 200 V, 400 V, 600 V or more. In addition, a power transistor may be required to conduct currents in the range of ones, tens or hundreds of amperes during normal operation. Due to the high electron mobility of the two-dimensional carrier gas in the heterojunction configuration, HEMTs offer high conduction and low losses in comparison to many conventional semiconductor transistor designs and therefore are well suited for these large operating currents.

Known HEMT designs have a number of limitations that detrimentally impact their suitability for power transistor applications. One limitation of GaN based technology in which the GaN material is epitaxially grown on a type IV semiconductor (e.g., Si) substrate relates to the breakdown strength of a GaN/AlGaN based HEMT. Conventionally, the breakdown strength of a GaN/AlGaN based HEMT can be improved by increasing the thickness of the GaN buffer layer. However, this technique introduces cost and complexity to the manufacturing process. In addition, in this GaN based technology in which the GaN material is epitaxially grown on a type IV semiconductor, the lattice mismatch between substrate and GaN induces a large number of defects/dislocations, which lead to poor dynamic on-resistance, current collapse and reliability concerns, e.g., due to the high electric fields between source and drain fingers at the surface of the devices due to the inherent lateral structure of the HEMT.

SUMMARY

A method of forming a semiconductor device is disclosed. According to an embodiment of the method, a first semiconductor body including type IV semiconductor material is provided. A second semiconductor body including type III-V semiconductor material is provided. A first adhesion layer is formed on the first semiconductor body. A second adhesion layer is formed on the second semiconductor body. The first and the second semiconductor bodies are bonded together by adhering the first and the second adhesion layers to one another.

According to another embodiment of the method, a first semiconductor body having SiC and doped active regions of a JFET in the first semiconductor body is provided. A second semiconductor body having type III-V semiconductor material is provided. A first adhesion layer is provided on the first surface of the first semiconductor body. A second adhesion layer is formed on the second semiconductor body. The first and the second semiconductor bodies are bonded together using the first and the second adhesion layers. A high electron mobility transistor is formed in the second semiconductor body after bonding the first and the second semiconductor bodies together. A contact structure that electrically connects one of the doped active regions to a terminal of the high electron mobility transistor is formed.

A transistor arrangement is disclosed. According to an embodiment, the transistor arrangement includes a first semiconductor body including type IV semiconductor material, and a second semiconductor body including type III-V semiconductor material. First and second electrically insulating adhesion layers are disposed between the first and the second semiconductor bodies and adhere the first and the second semiconductor bodies together. A vertical JFET is integrally formed in the first semiconductor body and includes a first conductivity type pinch-off region, and a current control region of a second conductivity type that is opposite the first conductivity type. A lateral high-electron-mobility transistor is integrally formed in the second semiconductor body and includes a barrier layer, a buffer layer having a different band gap than the barrier layer so that a two-dimensional charge carrier gas arises along an interface between the buffer layer and the barrier layer, and a gate structure being configured to control a conductive state of the two-dimensional charge carrier gas. An electrically conductive contact structure electrically connects a terminal of the SiC based transistor to a terminal of the high electron mobility transistor.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include a method of forming a composite semiconductor body that includes type IV semiconductor material and type III-V semiconductor material. According to one particular embodiment, the composite semiconductor body includes a first semiconductor body that includes silicon carbide (SiC) and a second semiconductor body includes type IV semiconductor material, e.g., GaN and AlGaN. A vertical semiconductor device, such as vertical JFET, is formed in the first semiconductor body. A lateral semiconductor device, such a lateral HEMT, is formed in the second semiconductor body. A conductive contact provides an electrical connection between the two semiconductor devices.

Advantageously, the methods described herein produce the composite semiconductor body without epitaxially growing the type III-V semiconductor material for the second semiconductor on top of the type IV semiconductor material of the first semiconductor body. The embodiments described herein utilize SiC as a base substrate for the epitaxial growth of type III-V semiconductor material thereon. One advantage of SiC as opposed to Si is smaller lattice mismatch between the two materials. This reduces the number of defects/dislocations and hence improves the on-resistance, current collapse and reliability. However, generally speaking, epitaxially growing type III-V semiconductor material such as GaN on top of type IV semiconductor material, and in particular on top of SiC, presents specific process challenges. According to this technique, prior to growing the type III-V semiconductor material, a nucleation layer must be formed on the SiC to enable epitaxial growth. The type III-V semiconductor material must be grown on off-axis SiC material. These steps present many challenges, and have not yet been perfected. The methods described herein avoid these challenges by concurrently forming a first semiconductor body that includes type IV semiconductor material (e.g., SiC) and a second semiconductor body that includes type III-V semiconductor material (e.g., GaN). Adhesive layers are formed separately on the first and second semiconductor bodies. These adhesive layers can include a variety of different materials including dielectric materials such as silicon dioxide ($SiO_2$) and silicon nitride (SiN). The first and second semiconductor bodies are bonded together using the adhesive layers. Subsequently, epitaxial growth of type III-V semiconductor material can take place on a planarized rear surface of the second semiconductor body. In this way, epitaxial growth of the type III-V semiconductor material on the SiC material and the consequent challenges associated with such a process are avoided.

Figure 1:
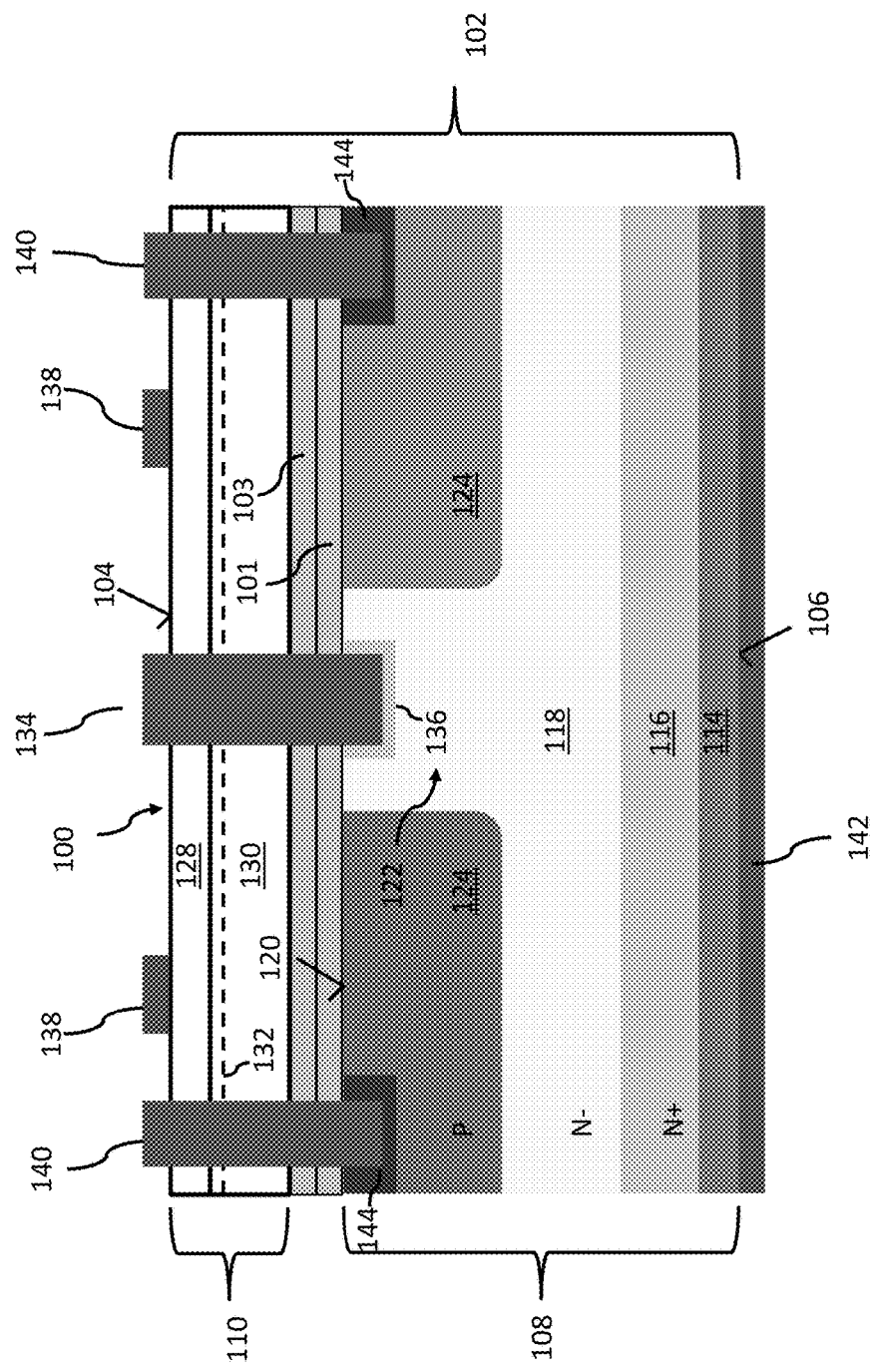
FIG. 1 depicts a quasi-vertical power transistor, according to an embodiment.

Referring to FIG. 1, a semiconductor device 100 is depicted, according to an embodiment. This semiconductor device 100 may be substantially similar or identical to the "Avalanche Rugged Quasi-Vertical HEMT" described in U.S. Pat. No. 9,570,438 to Curatola, the content of which is incorporated by reference in its entirety, with the only difference being the provision of first and second adhesive layers 101, 103 (to be described in further detail below) between the lateral HEMT device and the vertical JFET device.

The semiconductor device 100 is integrally formed in a composite semiconductor body 102. The composite semiconductor body 102 has an upper surface 104 and a lower surface 106 that is spaced apart from and opposite to the upper surface 104. The composite semiconductor body 102 includes a first semiconductor body 108 and a second semiconductor body 110. The first and second semiconductor bodies 108, 110 are vertically layered on top of one another. The first semiconductor body 108 extends to the lower surface 106 and the second semiconductor body 110 extends to the upper surface 104.

A vertical JFET device is incorporated into the first semiconductor body 108 and a lateral HEMT device is incorporated into the second semiconductor body 110. The various features of the vertical JFET device and the lateral HEMT device can be substantially similar or identical to the features from any of the embodiments of the "Avalanche Rugged Quasi-Vertical HEMT" described in U.S. Pat. No. 9,570,438 to Curatola. An intermediary region is disposed between the first semiconductor body 108 and the second semiconductor body 110, and adheres the first and second semiconductor bodies 108, 110 together.

According to an embodiment, the first semiconductor body 108 includes a first type IV semiconductor base substrate 114. The first type IV semiconductor base substrate 114 may have a first doping type (e.g., N-type). The first semiconductor body 108 additionally includes a type IV semiconductor buffer layer 116, which may have the first doping type, and may be more highly doped than the first semiconductor body 108. The first semiconductor body 108 additionally includes a type IV semiconductor drift layer 118 that extends to a first surface 120 of the first semiconductor body 108. The type IV semiconductor drift layer 118 may have the first doping type, and may be more lightly doped than the first type IV semiconductor base substrate 114 and the type IV semiconductor buffer layer 116.

A pinch-off region 122 and a current control region 124 extend from the first surface 120 of the first semiconductor body 108 into the type IV semiconductor drift layer 118. The pinch-off region 122 and the current control region 124 have opposite doping types. For example, the pinch-off region 122 may be an N-type region and the current control region 124 may be a P-type region. The pinch-off region 122 may be an intrinsically doped portion of the type IV semiconductor drift layer 118 that extends to the first surface 120 of the first semiconductor body 108 between adjacent ones of two current control regions 124.

The second semiconductor body 110 includes a barrier layer 128 and a buffer layer 130. The buffer layer 130 is formed from a semiconductor material having a different band gap than the semiconductor material that is used to form the barrier layer 128. As a result, the second semiconductor body 110 includes a heterojunction. The presence of piezoelectric and/or spontaneous polarization charges between the two materials (depending upon the material system) results in a two-dimensional charge carrier gas channel 132 that arises along an interface between the buffer layer 130 and the barrier layer 128.

The semiconductor device 100 additionally includes an electrically conductive substrate contact 134. According to an embodiment, the substrate contact 134 extends through the barrier and buffer layers 128, 130 and into the first semiconductor body 108 108. The electrically conductive substrate contact 134 is formed from an electrically conductive material, such as polysilicon, copper, aluminum, titanium or any suitable alloy. The substrate contact 134 forms a low resistance connection between the two-dimensional charge carrier gas channel 132 and the pinch-off region 122. For example, the substrate contact 134 may directly adjoin the two-dimensional charge carrier gas channel 132 and the pinch-off region 122 so as to provide a low-ohmic connection between the two. A highly doped contact region 136 of the first conductivity type may be formed in the first semiconductor body 108 and interposed between the substrate contact 134 and the doped pinch-off region 122 so as to lower the contact resistance between the substrate contact 134 and the pinch-off region 122. Furthermore, a silicide may be provided between the substrate contact 134 and the pinch-off region 122 to improve the contact resistance.

The semiconductor device 100 further includes an electrically conductive gate electrode 138, a first electrically conductive output contact 140 and a second electrically conductive output contact 142. A highly doped contact region 144 of the second conductivity type may be interposed between the first and second electrically conductive output contacts 140, 142 and the current control regions 124 so as to lower the contact resistance between the two.

The gate electrode 138 and the first and second output contacts 140, 142 are formed from an electrically conductive material, such as polysilicon, copper, aluminum, titanium or any of a variety of alloy materials (Au, TiN, TaN, Ti, Ni, Mo, W and any suitable combination). The gate electrode 138 and the first output contact 140 are formed on the upper surface 104 and the second output contact 142 is formed on the lower surface 106. As shown in FIG. 1, the gate electrode 138 is arranged above the upper surface 104, whereas the first output contact 140 penetrates into the composite semiconductor body 102. This is one example configuration, and a variety of contact configurations can be implemented to achieve the required electrical connectivity. According to an embodiment, the first output contact 140 is in ohmic contact with the two-dimensional charge carrier gas channel 132 and the current control region 124. As shown in FIG. 1, the first output contact 140 may be formed in a recess (e.g., an etched opening) extending into the composite semiconductor body 102 such that the electrically conductive substrate contact 134 directly contacts both the two-dimensional charge carrier gas channel 132 and the current control region 124.

The working principle of a quasi-vertical transistor that is formed by semiconductor device 100 of FIG. 1 is as follows. The first and second output contacts 140, 142 can provide the source and drain terminals of the quasi-vertical transistor, respectively. The quasi-vertical transistor utilizes two series connected transistors to control a current flow between the first and second output contacts 140, 142.

A first transistor is formed by a vertical JFET that is disposed in the first semiconductor body 108. The vertical JFET is formed by the drift current control region 124 and the pinch-off region 122, which is laterally adjacent to the drift current control region 124. Further, the pinch-off region 122 is in ohmic contact with the substrate contact 134 either by direct physical contact or by the optional contact region 124. A space charge region (i.e., a depletion region) arises at the p-n junction between the drift current control region 124 and the pinch-off region 122. The space charge region that forms in the pinch-off region 122 can be modulated to control the flow of carriers in the pinch-off region 122. A reverse bias of sufficient magnitude applied to this p-n junction will cause the space charge region to laterally expand across the pinch-off region 122 and to disrupt current flow in the pinch-off region 122. In this way, the drift current control region 124 provides a gate for the vertical JFET. The pinch-off region 122 may have the same doping concentration as a subjacent portion of the drift layer 118. Alternatively, the pinch-off region 122 may have a doping concentration that is at least two times higher than the doping concentration of the subjacent portion of the drift layer 118. This higher doping concentration enhances the current spreading capability of the first vertical section 132 and thus reduces the on-state resistance of the vertical JFET.

A second transistor is formed by a lateral HEMT that is disposed in the second device region 110. The gate of this lateral HEMT is provided by the gate electrode 138. The gate electrode 138 is disposed over the two-dimensional charge carrier gas channel 132 such that a conductive state of the two-dimensional charge carrier gas channel 132 can be influenced by the gate electrode 138. In some embodiments, a passivation layer (e.g., a layer of SiN) or a doped semiconductor layer (e.g., p-GaN) is disposed between the gate electrode 138 and the barrier layer 128. A suitable bias applied to the gate electrode 138 will complete or disrupt a conductive path between the first output contact 140 and the substrate contact 134. In this sense, the substrate contact 134 provides the "drain" of the lateral HEMT. Measures can be taken so that the lateral HEMT is a normally-off device. For example, the gate electrode 138 can be provided in a recessed portion of the barrier region 128 so as to locally deplete the two-dimensional charge carrier gas channel 132 underneath the gate electrode 138. Alternatively, doped regions (e.g., p-type GaN) can be provided underneath the gate electrode 138 to locally deplete the two-dimensional charge carrier gas channel 132. According to another technique, a region of piezoelectric material is disposed between the gate electrode 138 and the barrier layer and applies a mechanical stress that influences the conductive state of the two-dimensional charge carrier gas channel 132, e.g., as described in described in U.S. Pat. No. 9,147,740 to Siemieniec, the content of which is incorporated by reference in its entirety. Optionally, as shown in FIG. 1, the device 100 can be configured with two of the lateral HEMTs in a common drain configuration.

The quasi-vertical transistor is thus configured to control a current flowing between the first output contact 140 and the second output contact 142 by the two distinct transistor devices (i.e., the vertical JFET and the lateral HEMT) described above. The current in this quasi-vertical transistor is collectively controlled by the gate of the lateral HEMT and the gate of the vertical JFET. The quasi-vertical transistor is only "ON" (i.e., providing a conductive connection between the first and second output contacts 140, 142) if both the vertical JFET and lateral HEMT are turned "ON."

FIGS. 2-6 disclose selected method steps for forming the compound semiconductor body 102. This method may be used to form the semiconductor device 100 described with reference to FIG. 1. This method may also be used to form any of the embodiments of the "Avalanche Rugged Quasi-Vertical HEMT" described in U.S. Pat. No. 9,570,438 to Curatola.

Figure 2:
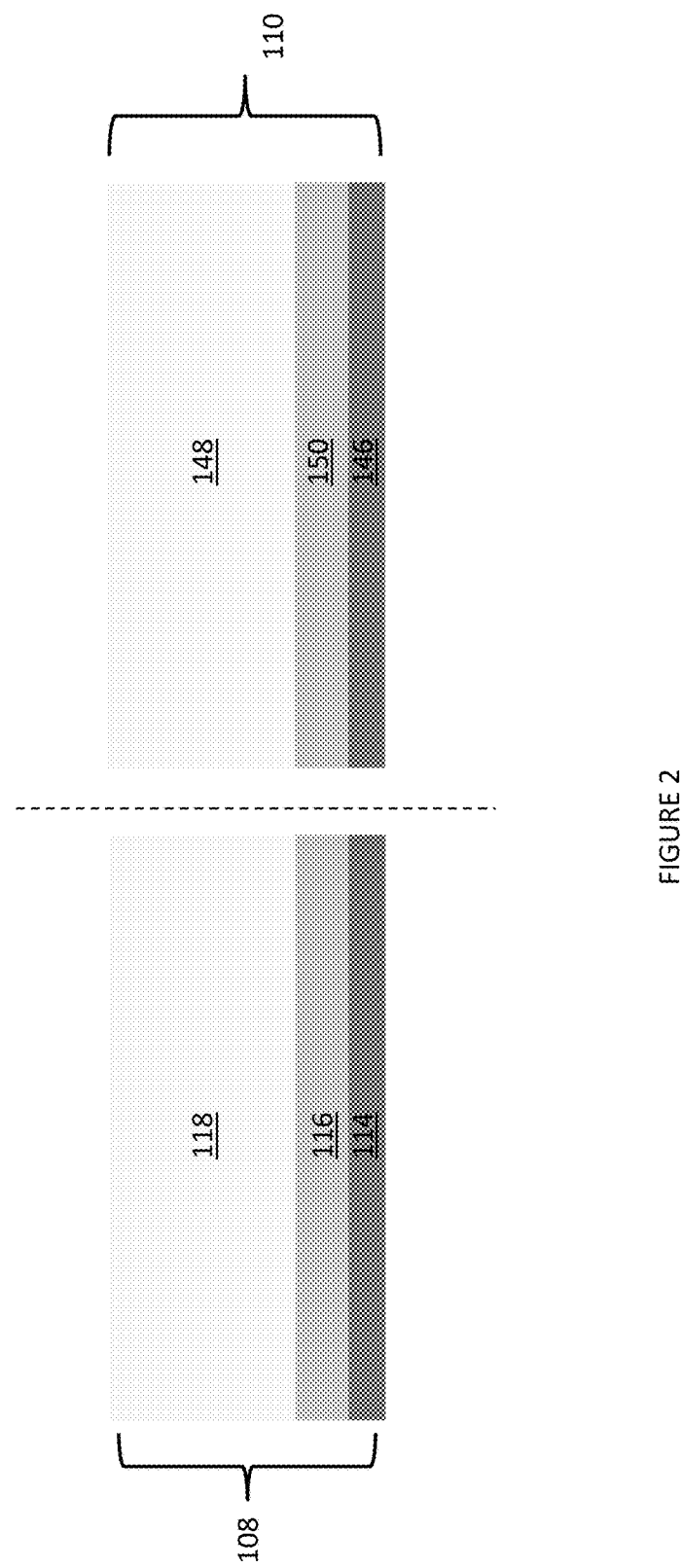
FIG. 2 depicts providing a first semiconductor body having type IV semiconductor material and a second semiconductor body having type III-V semiconductor material, according to an embodiment.

Referring to FIG. 2, two distinct (i.e., physically separate) semiconductor bodies are provided. A first semiconductor body 108 that includes type IV semiconductor material is provided. Additionally, a second semiconductor body 110 that includes type III-V semiconductor material is also provided.

According to an embodiment, providing the first semiconductor body 108 includes initially providing the first type IV semiconductor base substrate 114. The first type IV semiconductor base substrate 114 may be provided from a bulk semiconductor material or alternatively may be formed from an epitaxially grown layer. Generally speaking, the type IV semiconductor base substrate 114 can include a wide variety of group IV semiconductor materials such as Silicon (Si), compound group IV semiconductor materials such as Silicon carbide (SiC) or Silicon germanium (SiGe). In one particular embodiment, the first type IV semiconductor base substrate 114 is provided from a wide bandgap material. As used herein, a wide bandgap material refers to a semiconductor material with a bandgap of at least 2.4 eV. An example of a wide bandgap material is 3C-SiC.

After providing the first type IV semiconductor base substrate 114, a number of type IV semiconductor layers can be formed on the first type IV semiconductor base substrate 114 using an epitaxial growth technique. These type IV semiconductor layers can include the type IV semiconductor drift layer 118, and the type IV semiconductor buffer layer 116 that is disposed between the first type IV semiconductor base substrate 114 and the drift layer. The type IV semiconductor buffer layer 116 can include a graded doping concentration that is designed to alleviate lattice mismatch between the first type IV semiconductor base substrate 114 and the type IV semiconductor drift layer 118. The first type IV semiconductor base substrate 114, the type IV semiconductor buffer layer 116, and the type IV semiconductor drift layer 118 can be, but are not necessarily, formed from the same semiconductor material. For example, according to one embodiment, the first type IV semiconductor base substrate 114, the type IV semiconductor buffer layer 116, and the type IV semiconductor drift layer 118 each include Silicon carbide (SiC).

According to an embodiment, providing the second semiconductor body 110 includes initially providing a second type IV semiconductor base substrate 146. The second type IV semiconductor base substrate 146 may be provided from a bulk semiconductor material or alternatively may be formed from an epitaxially grown layer. Generally speaking, the second type IV semiconductor base substrate 146 can include a wide variety of group IV semiconductor materials such as Silicon (Si), compound group IV semiconductor materials such as Silicon carbide (SiC) or Silicon germanium (SiGe). For example, the second type IV semiconductor base substrate 146 can be provided from any commercially available bulk silicon wafer. After the second type IV semiconductor base substrate 146 is provided, a number of type III-V semiconductor layers can be formed on the second type IV semiconductor base substrate 146 using an epitaxial growth technique. Generally speaking, these type III-V semiconductor layers can include any III-V semiconductor material that is suitable for forming high electron mobility semiconductor devices. Examples of these materials include gallium nitride (GaN), aluminum gallium nitride (AlGaN), indium gallium nitride (InGaN), gallium arsenide (GaAs), aluminum gallium arsenide (AlGaAs), etc. These type III-V semiconductor layers can include a main type III-V semiconductor layer 148, and a type III-V semiconductor buffer layer 150 that is disposed between the second type IV semiconductor base substrate 146 and the main type III-V semiconductor layer 148. The type III-V semiconductor buffer layer 150 can include a graded metallic content that is designed to alleviate lattice mismatch between the second type IV semiconductor base substrate 146 and the main type III-V semiconductor layer 148. According to one embodiment, the second type IV semiconductor base substrate 146 includes Silicon (Si), and the type III-V semiconductor buffer layer 150 and the main type III-V semiconductor layer 148 each include GaN.

Figure 3:
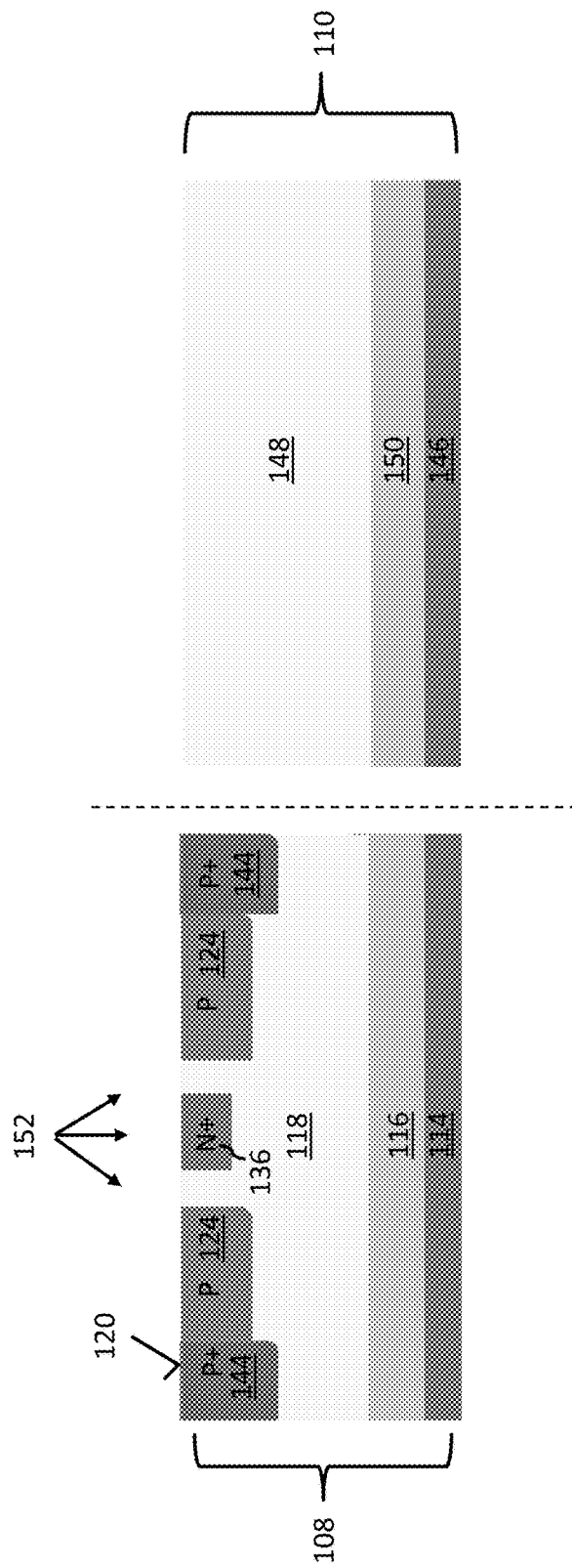
FIG. 3 depicts forming a plurality of doped regions in the first semiconductor body, according to an embodiment.

Referring to FIG. 3, after providing the first semiconductor body 108, a plurality of doped regions 152 is formed in the first semiconductor body 108. The doped regions 152 are formed at a first surface 120 of the first semiconductor body 108 that is opposite from the first type IV semiconductor base substrate 114. The doped regions 152 extend from the first surface 120 of the first semiconductor body 108 into the type IV semiconductor drift layer 118. These doped regions 152 can be device regions for an active semiconductor device (e.g., a transistor) that is integrated into the first semiconductor body 108. For example, according one embodiment, the doped regions 152 include the drift current control region 124 and the highly doped contact regions 136, 144 of the vertical JFET described with reference to FIG. 1. The doped regions 152 can be formed according to any of a variety of conventionally known techniques, e.g., implantation, diffusion, etc. For example, according to one embodiment, the doped regions 152 are formed by implanting dopants into the first surface 120 of the first semiconductor body 108. The various regions can be selectively formed in any desired geometry using masked implantation techniques. After ion implantation, an annealing step can be performed on in the first semiconductor body 108 to activate the dopant atoms.

Figure 4:
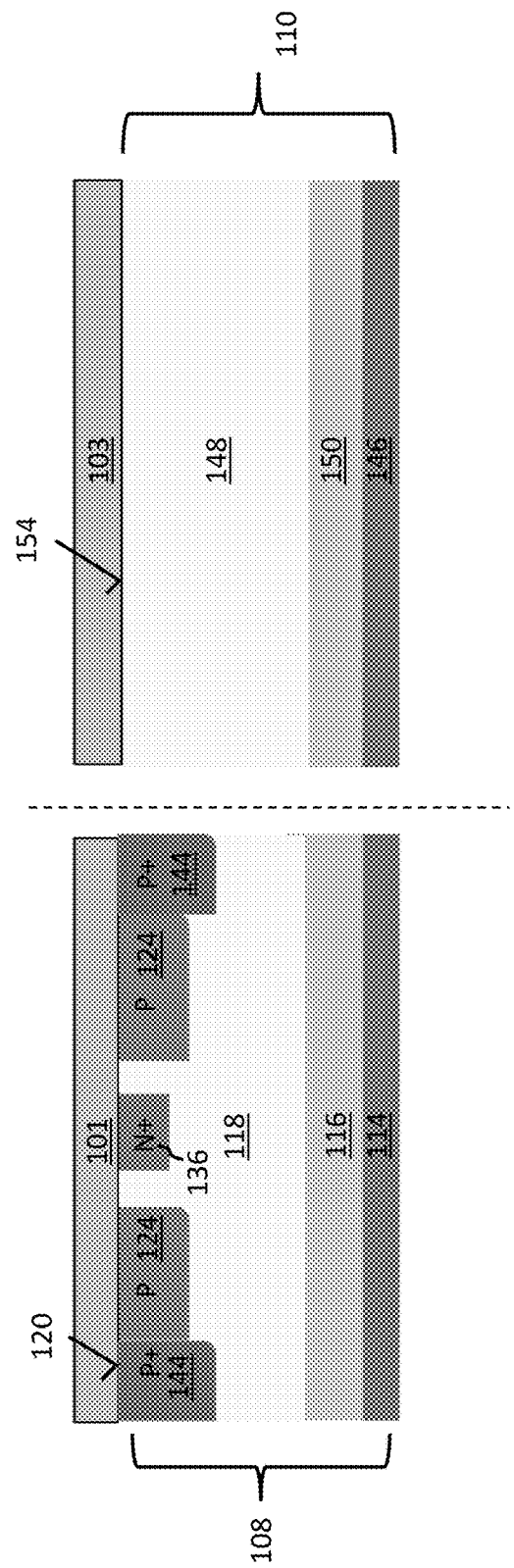
FIG. 4 depicts forming a first adhesion layer on the first semiconductor body and forming a second adhesion layer on the second semiconductor body, according to an embodiment.

Referring to FIG. 4, after forming the plurality of doped regions 152, adhesive layers are formed on the first and second semiconductor bodies 108, 110. A first adhesive layer 101 is formed on the first surface 120 of the first semiconductor body 108. A second adhesive layer 103 is formed on a first surface 154 of the second semiconductor body 110 that is opposite from the second type IV semiconductor base substrate 146. Generally speaking, the first and second adhesive layers 101, 103 can include any of a wide variety of materials that are used to bond two semiconductors together and are compatible with the underlying material of the first and second semiconductor bodies 108, 110. Exemplary materials that serve this purpose include electrical insulators with adhesive properties (e.g., semiconductor nitrides, semiconductor oxides, and semiconductor oxynitrides), non-conductive adhesive polymers (e.g., epoxy, resins, graphitized resin), adhesive tapes, etc. According to one embodiment, the first and second adhesive layers 101, 103 are electrically insulating layers that are grown on the first surface 120 of the first semiconductor body 108 and the first surface 154 of the second semiconductor body 110, respectively, using known deposition techniques. For instance, the first and second adhesive layers 101, 103 can include layers of silicon nitride (SiN), silicon dioxide ($SiO_2$), or silicon oxynitride ($SiO_xN_y$). According to one particular embodiment, the first and second adhesive layers 101, 103 are formed by initially forming a layer of silicon nitride (SiN) on the respective first surfaces 120, 154 of the first and second semiconductor bodies 108, 110, and subsequently forming a layer of silicon dioxide ($SiO_2$) on the respective layers of silicon nitride (SiN).

Figure 5:
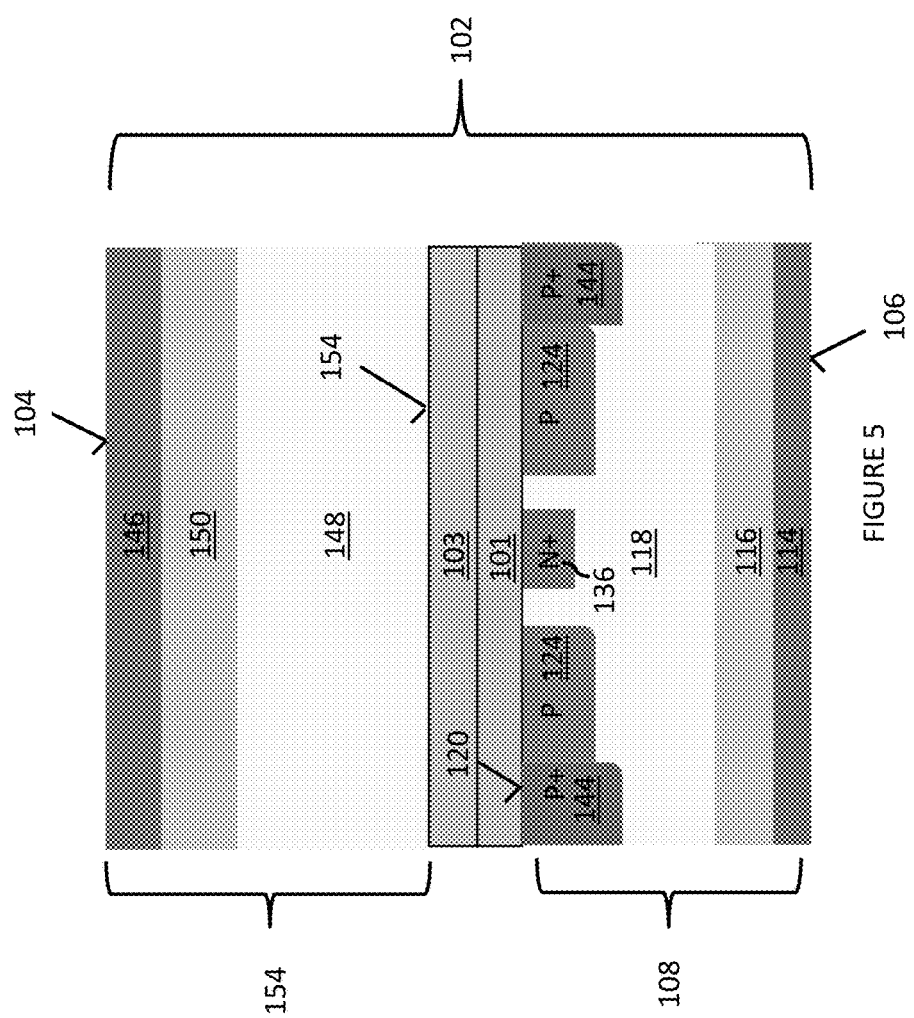
FIG. 5 depicts bonding the first semiconductor body and the second semiconductor body together using the first and second adhesion layers, according to an embodiment.

Referring to FIG. 5, after forming the first and second adhesive layers 101, 103, the first and second semiconductor bodies 108, 110 are bonded together using the first and second adhesive layers 101, 103. According to this technique, the first and second semiconductor bodies 108, 110 are oriented such that the first and second adhesive layers 101, 103 directly face one another, with the first type IV semiconductor base substrate 114 and the second type IV semiconductor base substrate 146 facing away from one another. Subsequently, the first and second semiconductor bodies 108, 110 are pressed together with the first and second adhesive layers 101, 103 directly contacting one another. Generally speaking, the first and second adhesive layers 101, 103 can be pressed together with sufficient pressure and temperature to form a reliable adhesive bond. The exact processes used to form an adhesive bond will depend upon the type of adhesive used. In an embodiment in which the first and second adhesive layers 101, 103 are semiconductor based insulators, an annealing process can be carried out while applying pressure to the first and second semiconductor bodies 108, 110. In an embodiment in which the first and second adhesive layers 101, 103 include silicon dioxide, exemplary parameters for the annealing process are between about 800° to 1300° for a duration of about 5 minutes to one hour. As a result of the bonding process, a composite semiconductor body 102 that includes type IV semiconductor material and type III-V semiconductor material is formed, wherein a rear surface of the second type IV semiconductor base substrate 146 provides the upper surface 104 of the composite semiconductor body 102 and a rear surface of the first type IV semiconductor base substrate 114 provides the lower surface 106 of the composite semiconductor body 102.

Figure 6:
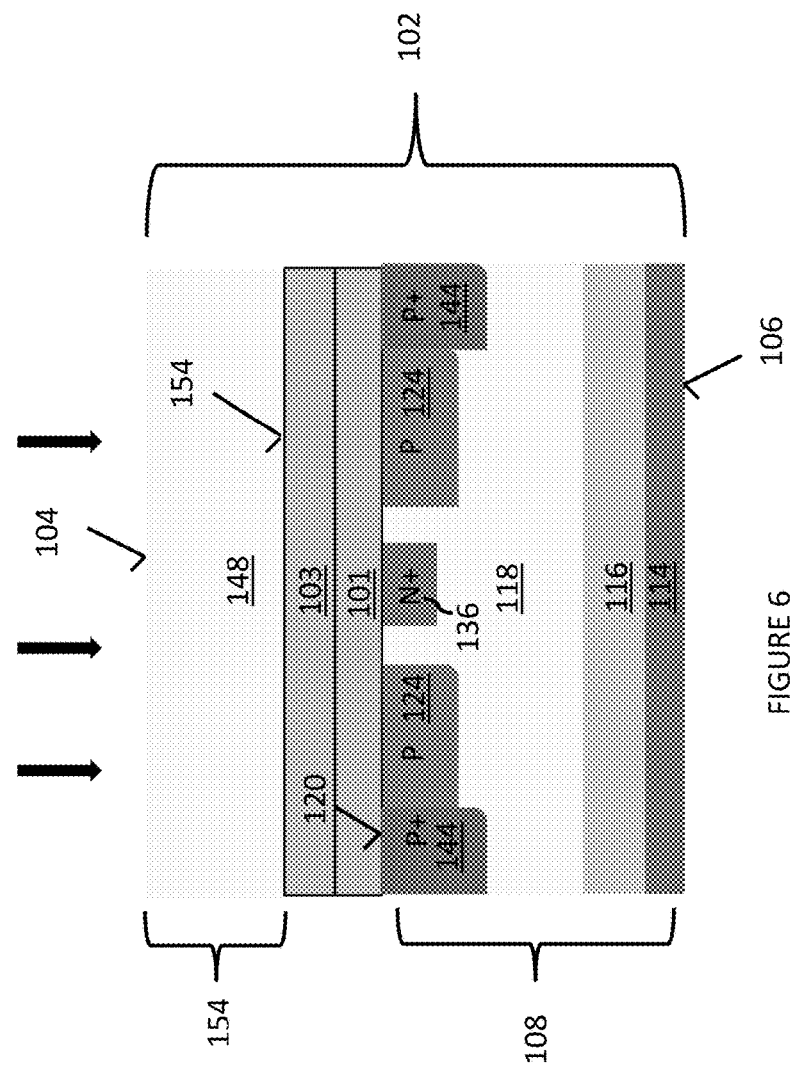
FIG. 6 depicts removing semiconductor material away from an upper side of the composite semiconductor body that includes the first and second semiconductor bodies, according to an embodiment.

Referring to FIG. 6, after the first and second semiconductor bodies 108, 110 are bonded together, the second type IV semiconductor base substrate 146 is removed from the composite semiconductor body 102. The second type IV semiconductor base substrate 146 can be completely removed from the composite semiconductor body 102. As a result, the type III-V semiconductor material of the second semiconductor body 110 is exposed at the upper surface 104 of the composite semiconductor body 102. This process can also remove the type III-V semiconductor buffer layer 150 and at least part of the main type III-V semiconductor layer 148. As a result, the upper surface 104 of the composite semiconductor body 102 includes a substantially defect and strain free type III-V semiconductor surface for the growth of epitaxial type III-V semiconductor material thereon. Removing semiconductor material from the composite semiconductor body 102 as depicted in FIG. 6 can be done according to any of a wide variety of known planarization techniques, such as chemical-mechanical planarization (CMP). Alternatively, chemical etching, mechanical grinding techniques, and/or dry etching techniques can be utilized to remove some or all of the semiconductor material.

Figure 7:
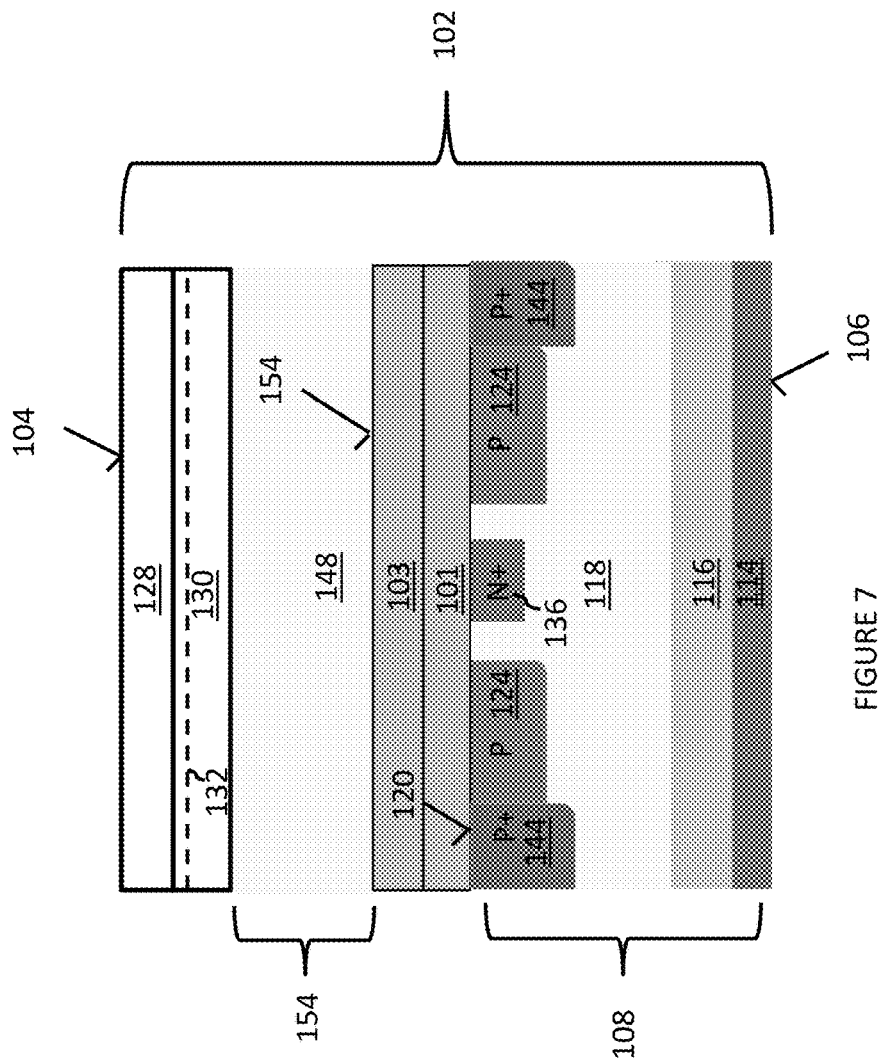
FIG. 7 depicts forming barrier and buffer layers on the composite semiconductor body, according to an embodiment.

Referring to FIG. 7, after the second type IV semiconductor base substrate 146 is removed from the composite semiconductor body 102, channel regions for the lateral HEMT device are formed on the upper surface 104 of the composite semiconductor body 102. Specifically, the buffer layer 130 is formed on the exposed type III-V semiconductor material of the second semiconductor body 110. Subsequently, the barrier layer 128 is formed on the buffer layer 130. Both the buffer layer 130 and the barrier layer 128 can be formed using an epitaxial deposition technique, for example. The buffer layer 130 is formed from a semiconductor material having a different band gap than the barrier layer 128. For example, the buffer layer 130 can include intrinsic or lightly doped gallium nitride (GaN) and the barrier layer 128 can include aluminum gallium nitride (AlGaN). More generally, any combination of type III-V semiconductor materials with different metallic contents can be used to provide a difference in bandgap. Due to the difference in bandgap between the buffer and barrier layers 128, 130, an electrically conductive two-dimensional charge carrier gas channel 132 arises near an interface between the buffer and barrier layers 128, 130 due to polarization effects.

After forming the buffer and barrier layers 128, 130 according to the technique described with reference to FIG. 6, the electrically conductive gate electrode 138, the first electrically conductive output contact 140 and the substrate contact 134 can be formed at the upper surface 104 of the composite semiconductor body 102. The second electrically conductive output contact 142 can be formed at the rear surface 106 of the composite semiconductor body 102. These structures can be formed according to any of a wide variety of known techniques, including the techniques described in U.S. Pat. No. 9,570,438 to Curatola. In this case, the first and second adhesive layers 101, 103 form an insulating region between the first and second semiconductor bodies 108, 110. The only electrical connection between the two regions is provided by the substrate contact 134, which can be formed by etching a contact hole through the second semiconductor body 110 (i.e., through the barrier and buffer layer 128, 130), through the first and second adhesive layers 101, 103, and into the highly doped contact region.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer 130 structures. In general, the normally-off compound semiconductor transistor can be realized using any suitable III-nitride technology such as GaN that permits the formation of opposite polarity inversion regions due to piezoelectric effects.

The term "in ohmic contact" or "electrically connected" or "in electrical contact" describes a permanent, non-rectifying electrical junction between two conductors that has linear current-voltage (I-V) characteristics, as with Ohm's law. By contrast, the term "electrically coupled" means that one or more intervening element(s) configured to influence the electrical signal in some tangible way is be provided between the electrically coupled elements. These intervening elements include active elements, such as transistors, as well as passive elements, such as inductors, capacitors, diodes, resistors, etc.

The term "lateral" as used in this specification intends to describe an orientation substantially parallel to a first or main surface of a semiconductor substrate or body. This can be for instance the surface of a wafer or a die.

The term "vertical" as used in this specification intends to describe an orientation that is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration that is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

The term "power semiconductor device" as used in this specification intends to describe a semiconductor device on a single chip with high voltage and/or high current switching capabilities. In other words, power semiconductor devices are intended for high current, typically in the range of one or more Amperes and/or high voltages, typically above 100 V, more typically above 400 V.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of forming a semiconductor device, the method comprising:
 providing a first semiconductor body comprising type IV semiconductor material;
 providing a second semiconductor body comprising type III-V semiconductor material;
 forming a first adhesion layer on the first semiconductor body;
 forming a second adhesion layer on the second semiconductor body; and
 bonding the first and the second semiconductor bodies together by adhering the first and the second adhesion layers to one another, and
 wherein the second semiconductor body is provided to include a second type IV semiconductor base substrate and one or more type III-V semiconductor layers on the second type IV semiconductor base substrate,
 wherein the method further comprises, after bonding first and the second semiconductor bodies together, removing the second type IV semiconductor base substrate from the second semiconductor body to expose type III-V semiconductor material at an upper surface of a composite semiconductor body that includes the first and second semiconductor bodies,
 wherein the upper surface of the composite semiconductor body is exclusively provided from III-V semiconductor material after removing the second type IV semiconductor base substrate.

2. The method of claim 1,
 wherein providing the first semiconductor body comprises:
 providing a first type IV semiconductor base substrate; and
 epitaxially growing one or more type IV semiconductor layers on the first type IV semiconductor base substrate,
 wherein providing the second semiconductor substrate comprises:
 providing the second type IV semiconductor base substrate; and
 epitaxially growing the one or more type III-V semiconductor layers on the second type IV semiconductor base substrate,
 wherein the first adhesion layer is formed on a first surface of the first semiconductor body that is opposite from the first type IV semiconductor base substrate, and wherein the second adhesion layer is formed on a first surface of the second semiconductor body that is opposite from the second type IV semiconductor base substrate.

3. The method of claim 2, further comprising, prior to bonding the first and the second semiconductor bodies together: forming a plurality of doped regions in the first semiconductor body that extend from the first surface of the first semiconductor body into one of the epitaxially grown type IV semiconductor layers.

4. The method of claim 3, wherein the first adhesion layer is formed on the first surface of the first semiconductor body after forming the plurality of doped regions.

5. The method of claim 1, further comprising, after removing the second type IV semiconductor base substrate from the second semiconductor body:
 epitaxially forming a first type III-V semiconductor layer on the upper surface of the composite semiconductor body;
 epitaxially forming a second type III-V semiconductor layer on the first type III-V semiconductor layer;
 wherein the first and the second type III-V semiconductor layers have a difference in bandgap such that a two-dimensional charge carrier gas forms along an interface between the first and the second type III-V semiconductor layers.

6. The method of claim 5, further comprising, after epitaxially forming the first and the second type III-V semiconductor layers:
 forming an electrically conductive contact that extends through the second semiconductor body and the first and the second adhesion layers and into the first semiconductor body,
 wherein the electrically conductive contact forms an ohmic connection between the two-dimensional charge carrier gas and a doped type IV semiconductor region that extends to the first surface of the first semiconductor body.

7. The method of claim 2, wherein the first and the second adhesion layers each comprise at least one of silicon nitride, silicon dioxide, and silicon oxynitride.

8. The method of claim 7, wherein bonding the first and the second semiconductor bodies together comprises:

directly contacting the first and the second adhesion layers with one another;
annealing the first and the second adhesion layers; and
applying pressure to the first and the second semiconductor bodies to press the first and the second adhesion layers together.

9. A method of forming a semiconductor device, the method comprising:
providing a first semiconductor body comprising SiC and doped active regions of a JFET in the first semiconductor body;
providing a second semiconductor body comprising type III-V semiconductor material;
forming a first adhesion layer on the first surface of the first semiconductor body;
forming a second adhesion layer on the second semiconductor body;
bonding the first and the second semiconductor bodies together using the first and the second adhesion layers;
forming a high electron mobility transistor in the second semiconductor body after bonding the first and the second semiconductor bodies together; and
forming a contact structure that electrically connects one of the doped active regions to a terminal of the high electron mobility transistor,
wherein the JFET is configured as a vertical JFET comprising a first conductivity type pinch-off region and a current control region of a second conductivity type that is opposite the first conductivity type, the current control region being configured to modulate a current in the first conductivity type pinch-off region, and wherein the high electron mobility transistor is a lateral high-electron-mobility transistor comprising a barrier layer and a buffer layer having a different band gap than the barrier layer so that a two-dimensional charge carrier gas arises along an interface between the buffer layer and the barrier layer, and wherein forming the contact structure electrically connects the vertical JFET and the lateral high-electron-mobility transistor in series with one another.

10. The method of claim 9, wherein providing the first semiconductor body comprises:
providing a silicon carbide base substrate;
epitaxially growing a silicon carbide drift layer on silicon carbide base substrate, the drift layer having the first conductivity type; and
forming two of the current control regions that extend from a first surface of the first semiconductor body into the drift layer, the first surface being opposite the silicon carbide base substrate,
and wherein the pinch-off region is formed by a portion of the drift region that extends to the first surface in between the two drift current control regions.

11. The method of claim 10, wherein the first adhesion layer is formed on the first surface of the first semiconductor body after forming the two of the current control regions.

12. The method of claim 9, wherein providing the second semiconductor substrate comprises:
providing a silicon base substrate; and
epitaxially growing one or more type III-V semiconductor layers on the silicon base substrate.

13. The method of claim 12, further comprising, after bonding the first and the second semiconductor bodies together:
removing the silicon base substrate from the second semiconductor body to expose type III-V semiconductor material at an upper surface of a composite semiconductor body that includes the first and second semiconductor bodies.

14. The method of claim 13, wherein forming the high electron mobility transistor comprises, after removing the silicon base substrate,
epitaxially forming the buffer and the barrier layers; and
forming a gate structure at the rear surface of the second semiconductor body.

15. The method of claim 14, wherein forming the contact structure comprises, after epitaxially forming the buffer and the barrier layers, forming an electrically conductive contact that extends through the second semiconductor body and the first and the second adhesion layers and into the first semiconductor body,
wherein the electrically conductive contact forms an ohmic connection between the two-dimensional charge carrier gas and the pinch-off region of the vertical JFET.

16. A method of forming a semiconductor device, the method comprising:
providing a first semiconductor body comprising type IV semiconductor material;
providing a second semiconductor body comprising type III-V semiconductor material;
forming a first adhesion layer on the first semiconductor body;
forming a second adhesion layer on the second semiconductor body;
bonding the first and the second semiconductor bodies together by adhering the first and the second adhesion layers to one another;
planarizing an upper surface of the second semiconductor body that faces away from the first and the second adhesion layers to form an exposed planar surface of type III-V semiconductor material;
epitaxially growing first and second layers of type III-V semiconductor material on the exposed planar surface after the planarizing, the first and the second type III-V semiconductor layers having a difference in bandgap such that a two-dimensional charge carrier gas forms along an interface between the first and the second type III-V semiconductor layers; and
forming a high electron mobility transistor in the first and second layers of type III-V semiconductor material, wherein the two-dimensional charge carrier gas provides the channel of the high electron mobility transistor.

17. The method of claim 16, further comprising:
forming a vertical semiconductor device in the first semiconductor body prior to the bonding the first and the second semiconductor bodies together; and
electrically connecting the vertical semiconductor device to the channel of the high electron mobility transistor by a conductive contact that extends through the first and the second adhesion layers.

* * * * *